(12) United States Patent
Lee

(10) Patent No.: US 6,476,459 B2
(45) Date of Patent: *Nov. 5, 2002

(54) SEMICONDUCTOR INTEGRATED CIRCUIT DEVICE WITH CAPACITOR FORMED UNDER BONDING PAD

(75) Inventor: Sang-Heon Lee, Yongin-shi (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/352,218

(22) Filed: Jul. 13, 1999

(65) Prior Publication Data

US 2002/0113287 A1 Aug. 22, 2002

(30) Foreign Application Priority Data

Jul. 15, 1998 (KR) .............................. 98-28558

(51) Int. Cl.⁷ .......................... H01L 29/00; H01L 21/44
(52) U.S. Cl. ................. 257/503; 257/700; 257/758; 257/774; 257/781; 257/786; 438/612; 438/629; 438/667
(58) Field of Search .................. 257/503, 735, 257/741, 666, 781, 758, 700, 701, 773, 774, 775, 778, 779, 786; 438/461, 123, 611, 622, 125, 108, 612, 629, 667, 666

(56) References Cited

U.S. PATENT DOCUMENTS

| 3,287,612 A | * | 11/1966 | Lepselter ..................... 257/763 |
| 3,751,292 A | * | 8/1973 | Kongable ..................... 117/212 |
| 3,824,678 A | * | 7/1974 | Harris et al. ................... 29/578 |
| 4,112,196 A | * | 9/1978 | Selig et al. .................. 428/594 |
| 5,016,087 A | * | 5/1991 | Haug et al. .................. 257/750 |
| 5,066,614 A | * | 11/1991 | Dunaway et al. ....... 228/180.21 |
| 5,134,539 A | * | 7/1992 | Tuckerman et al. ......... 361/311 |
| 5,162,264 A | * | 11/1992 | Haung et al. ................ 438/107 |
| 5,177,670 A | * | 1/1993 | Shinohara et al. .......... 361/388 |
| 5,287,002 A | * | 2/1994 | Freeman, Jr. et al. ....... 257/781 |
| 5,394,013 A | * | 2/1995 | Oku et al. .................... 257/786 |
| 5,403,729 A | * | 4/1995 | Richards et al. ............. 438/411 |
| 5,587,333 A | * | 12/1996 | Johansson et al. .......... 438/394 |
| 5,650,357 A | * | 7/1997 | Dobkin et al. .............. 438/107 |
| 5,753,537 A | * | 5/1998 | Dekker et al. .............. 438/113 |
| 5,858,815 A | * | 1/1999 | Heo et al. ................... 438/112 |
| 6,054,759 A | * | 4/2000 | Nakamura ................... 257/691 |

FOREIGN PATENT DOCUMENTS

| EP | 746024 | * | 4/1996 |
| JP | 63-142656 | * | 6/1988 |
| JP | 2-47862 | * | 2/1990 |
| JP | 4-120771 | * | 4/1992 |
| JP | 4-211191 | * | 8/1992 |
| JP | 6-188568 | * | 7/1994 |
| JP | 9-307067 | * | 11/1997 |
| JP | 2000-31415 | * | 1/2000 |

* cited by examiner

Primary Examiner—David L. Talbott
Assistant Examiner—Alonzo Chambliss
(74) Attorney, Agent, or Firm—F.Chau & Associates, LLP

(57) ABSTRACT

A semiconductor device is provided which includes a semiconductor substrate having a main surface. A bonding pad is formed on the main surface. A multi-layer wiring structure is disposed between the main surface and the bonding pad. The multi-layer wiring structure includes a first wiring layer, a second wiring layer, and an interlayer insulating film therebetween. The first layer, the second layer, and the interlayer film form a capacitor disposed under the bonding pad.

13 Claims, 5 Drawing Sheets

US 6,476,459 B2

SEMICONDUCTOR INTEGRATED CIRCUIT DEVICE WITH CAPACITOR FORMED UNDER BONDING PAD

FIELD OF THE INVENTION

The present invention relates generally to a semiconductor device and, more particularly, to a semiconductor integrated circuit device having a capacitor formed under a bonding pad.

BACKGROUND OF THE INVENTION

In general, the wafer area (i.e., chip area) occupied by a VLSI (very large scale integration) device is gradually increasing. More particularly, as the capacitance of a memory semiconductor integrated circuit increases and a plurality of function blocks (or chips) for performing various functions are integrated into one, the chip area of the VLSI device continuously increases.

FIG. 1 is a diagram illustrating a conventional semiconductor integrated circuit 1 (hereinafter "IC" or "chip"). The chip 1 includes a plurality of bonding pads 12 arranged therein. Power wiring 14 supplies external supply voltage to the interior of the chip 1. Since the power wiring 14 is generally made of metal, the chip area occupied by the power wiring 14 is selectively greater than that occupied by other signal wiring. The plurality of bonding pads 12 connect the chip interior to the exterior thereof. The bonding pads 12 are electrically connected to corresponding package pins (not shown). The power wiring 14 is arranged inside the chip 1 as shown in FIG. 1. To simplify the illustration, ground voltage is not shown. The power wiring 14 occupies most of the area of the chip 1. The bonding pads 12 also occupy a significant area of the chip 1. In general, a semiconductor integrated circuit is not arranged adjacent to an area where the bonding pads 12 are formed.

In order to provide many chips in the same wafer, it is necessary to efficiently reduce a chip area which is continuously increasing.

SUMMARY OF THE INVENTION

An object of the present invention is to provide a semiconductor integrated circuit device having a capacitor formed under a bonding pad.

Another object of the present invention is to provide a semiconductor integrated circuit device having a power wiring structure arranged under a bonding pad.

According to a first aspect of the present invention, a semiconductor device includes a semiconductor substrate having a main surface. A bonding pad is formed on the main surface. A multi-layer wiring structure is disposed between the main surface and the bonding pad. The multi-layer wiring structure includes a first wiring layer, a second wiring layer, and an interlayer insulating film therebetween.

According to a second aspect of the present invention, the first layer, the second layer, and the interlayer film form a capacitor disposed under the bonding pad.

According to a third aspect of the present invention, widths of the first and the second wiring layers are respectively equal to and wider than a width of said bonding pad.

According to a fourth aspect of the present invention, the first wiring layer is formed by using ground wiring for receiving an external ground voltage, and the second wiring layer is formed by using power wiring for receiving an external supply voltage.

According to a fifth aspect of the present invention, the capacitor is used to stabilize ground voltage noise or supply voltage noise.

According to sixth aspect of the present invention, a semiconductor device includes a semiconductor substrate having a main surface. A plurality of bonding pads are formed on an area of the main surface. A first conductive layer having a plurality of first conductive patterns is formed on the main surface and arranged along the area. A second conductive layer having a plurality of second conductive patterns is formed between the main surface and the first conductive layer and arranged along the area to overlap with the first conductive patterns. An insulating layer is disposed between the first and the second conductive layers.

According to a seventh aspect of the present invention, a semiconductor device includes a semiconductor substrate having a main surface. A plurality of bonding pads are formed on an area of the main surface. A first wiring layer is arranged between the main surface and the pads and grown along the area. A second wiring layer is arranged between the main surface and the first wiring layer and along the area. An insulating layer is arranged between and in contact with the wiring layers.

According to an eighth aspect of the present invention, the first wiring layer has a plurality of via holes under the bonding pads to reduce stress generated when the bonding pads are bonded to external package pins.

According to a ninth aspect of the present invention, a semiconductor device having a plurality of bonding pads includes a conductive semiconductor substrate having a main surface. A conductive active region is formed in the semiconductor substrate. An insulating layer is formed on the main surface. A conductive layer is formed on the insulating layer. The conductive active region, the insulating layer, and the conductive layer are formed below the plurality of bonding pads.

According to a tenth aspect of the present invention, the active region is simultaneously formed when source/drain regions of a metal oxide semiconductor transistor are formed, and the conductive layer is simultaneously formed when a gate electrode of the transistor is formed.

According to an eleventh aspect of the present invention, a semiconductor device having a plurality of bonding pads includes a conductive semiconductor substrate having a main surface. A conductive layer has a plurality of conductive patterns formed on the main surface and arranged along an area having the bonding pads. An insulating layer is formed between the main surface and the conductive layer. A plurality of conductive active regions are formed in the semiconductor substrate along the bonding pad region.

DETAILED DESCRIPTION OF PREFERRED EMBODIMENTS

Figure 1:
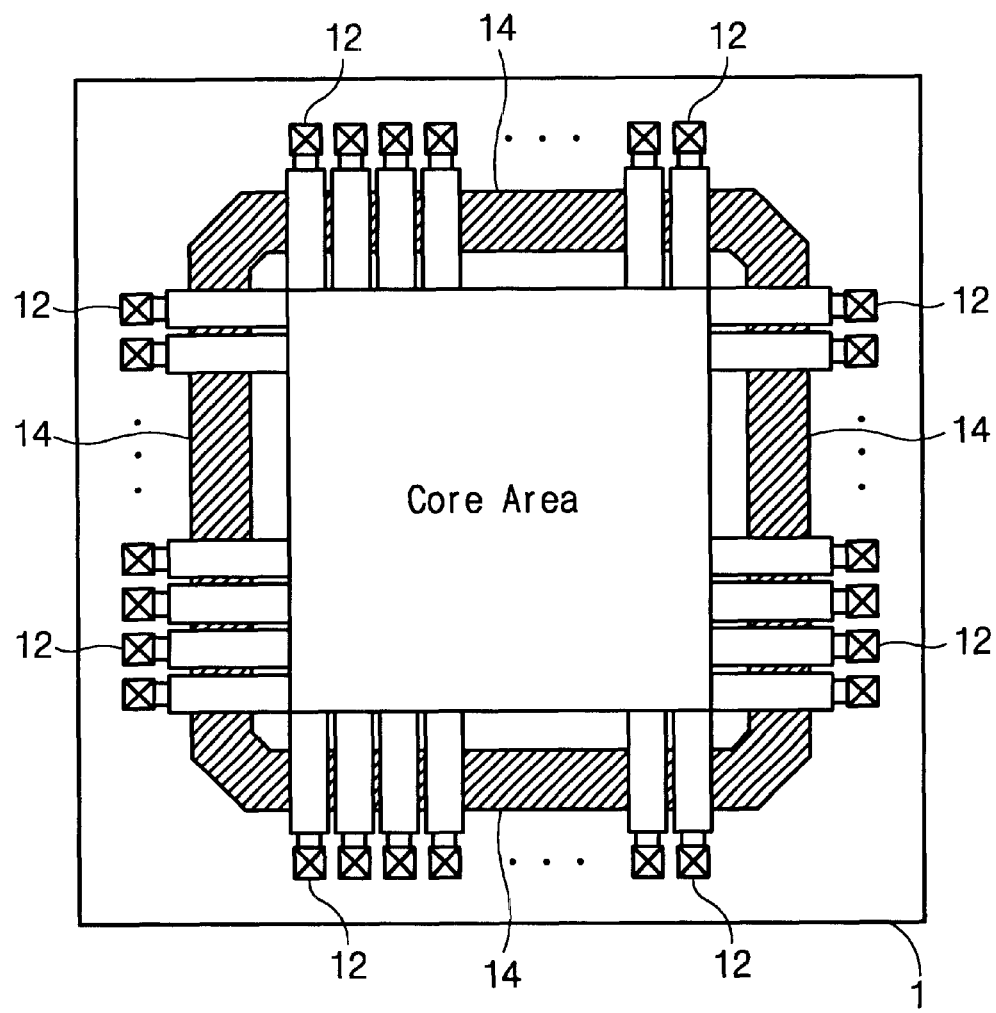
FIG. 1 is a diagram illustrating a conventional semiconductor integrated circuit device having a power line array and a bonding pad.
Figure 2:
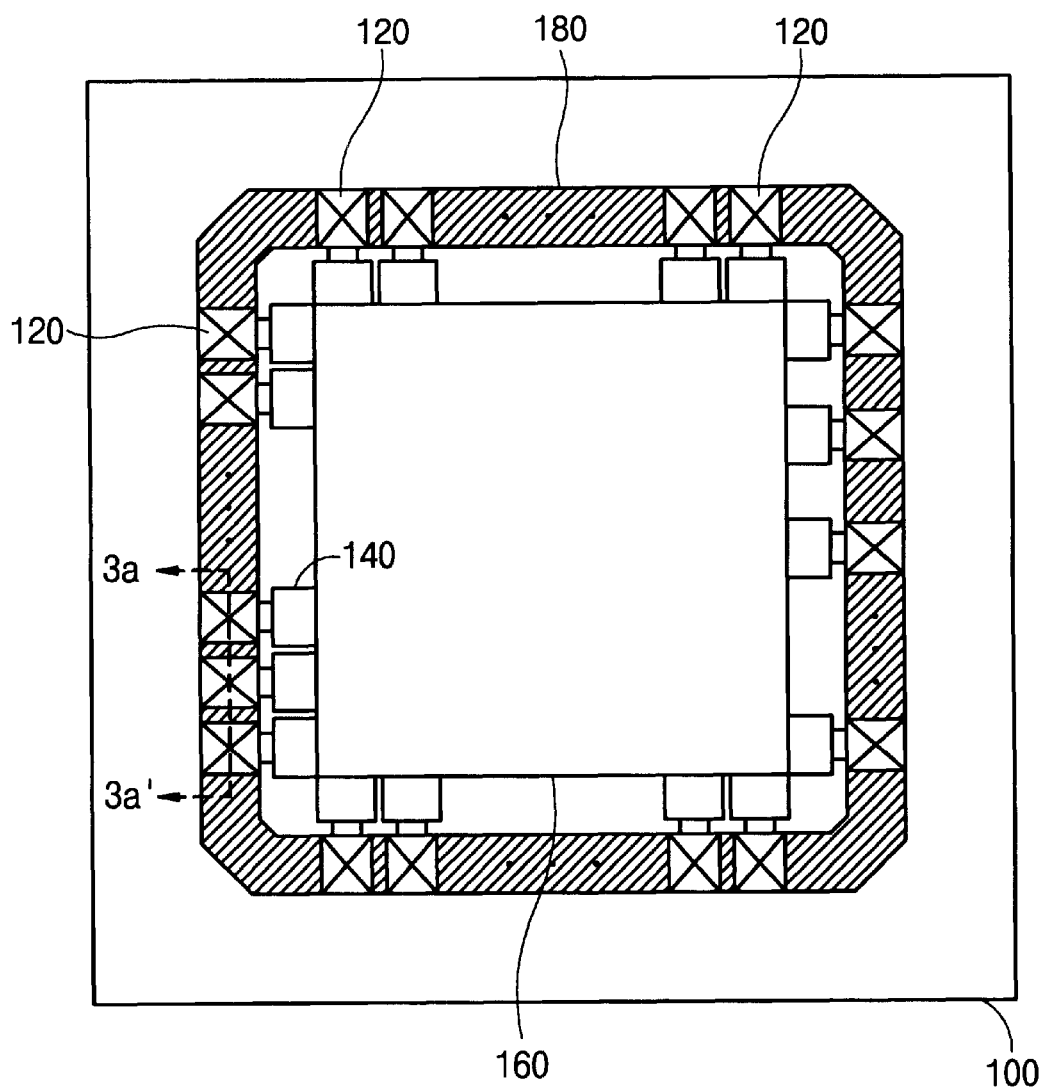
FIG. 2 is a diagram illustrating a semiconductor integrated circuit device according to a first preferred embodiment of the present invention.

FIG. 2 is a diagram illustrating a semiconductor integrated circuit device 100 (hereinafter "IC" or "chip") according to a first preferred embodiment of the present invention. A plurality of bonding pads 120, which connect the interior of the chip 100 to the exterior thereof, are arranged along a peripheral area of the chip 100. Each of the bonding pads 120 are electrically connected to a core area 160 through corresponding input/output circuits 140. Integrated circuits (not shown) such as memory cells, logic circuits, or similar circuits thereof are formed in the core area 160. A metal wiring or a conductive layer 180 is arranged in the area where the bonding pads 120 are arranged and under the bonding pads 120. According to the foregoing layout, it is apparent to those skilled in the art that the semiconductor integrated circuit device 100 of the present invention occupies less area than that of a semiconductor integrated circuit device according to the prior art.

Figure 3:
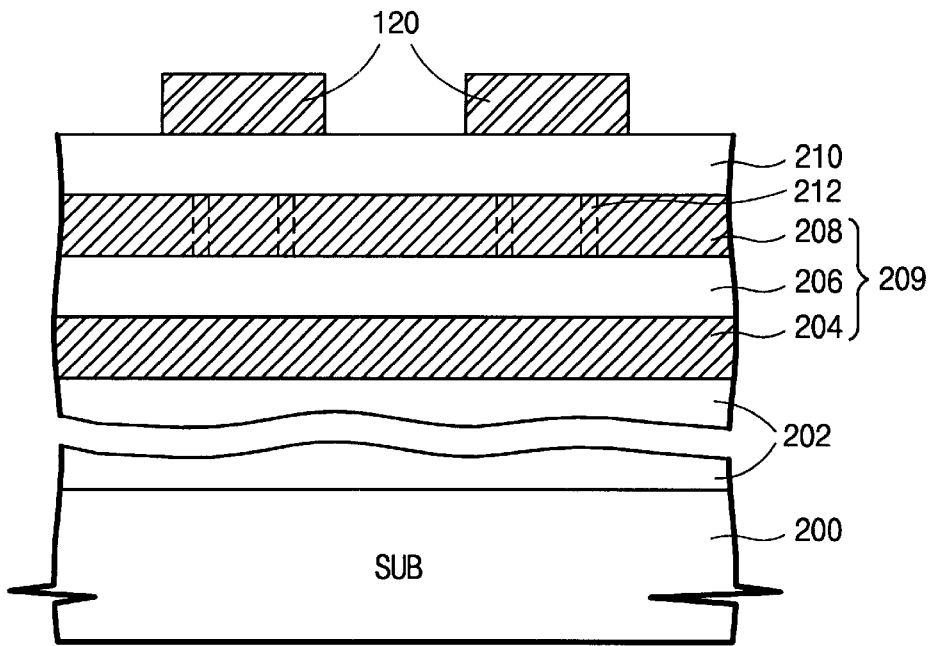
FIG. 3 is a cross sectional view taken along line 3a—3a of FIG. 2, illustrating the lower structure of a bonding pad.

FIG. 3 is a cross sectional view taken along line 3a—3a of FIG. 2, illustrating the lower structure of a bonding pad. Referring to FIG. 3, conductive layers 204 and 208 for supplying external supply voltage and external ground voltage to the interior of the chip are formed on the semiconductor substrate 200. The conductive layer 208 is arranged on the conductive layer 204 and an interlayer insulating film 206 is inserted therebetween. The conductive layer 204 is formed on an insulating layer 202 which is in contact with the semiconductor substrate 200. The bonding pads 120 are formed on an insulating layer 210 which is in contact with the conductive layer 208. The conductive layers 204 and 208 are respectively used as a power rail and a ground rail for supplying external supply power to the interior of the chip. The conductive layers 204 and 208 are made of metal. If the supply rail 208 and the ground rail 204 are arranged as shown in FIG. 2 (that is, under the bonding pads 120), the semiconductor integrated circuit of the present invention will occupy less chip area than that occupied by a prior art semiconductor integrated circuit. In order to reduce stress created during formation of the wiring connecting the bonding pads 120 to external package pins, via holes 212 are formed in the conductive layer 208 under the bonding pads 120. The conductive layers 204 and 208 are made of a conductive material (for example, polysilicon) used in forming a semiconductor integrated circuit (not shown) in the core area 160 of FIG. 2.

The conductive layers 204 and 208 and the insulating layer 206 serve as a capacitor 209. The conductive layer 204 serves as one electrode of the capacitor 209 and the conductive layer 208 serves as another electrode thereof. The conductive layer 204 is coupled to the external voltage and the conductive layer 208 is All connected to the ground voltage. The capacitance value of the capacitor 209 may be expressed as C=∈×(A/D).

Herein, C is capacitance (in farads), A is the area of the electrode 204 or 208, and D is the distance between the electrodes 204 and 208. Accordingly, the capacitor 209 may have the required capacitance value by controlling the area A and the distance D. The ∈ may be increased by using the insulating layer 206 having a higher dielectric constant than the electrodes 204 and 208. The conductive layers 204 and 208 are grown to the direction that the bonding pads 120 are arranged, so that high capacitance capacitor 209 may be obtained.

Figure 4:
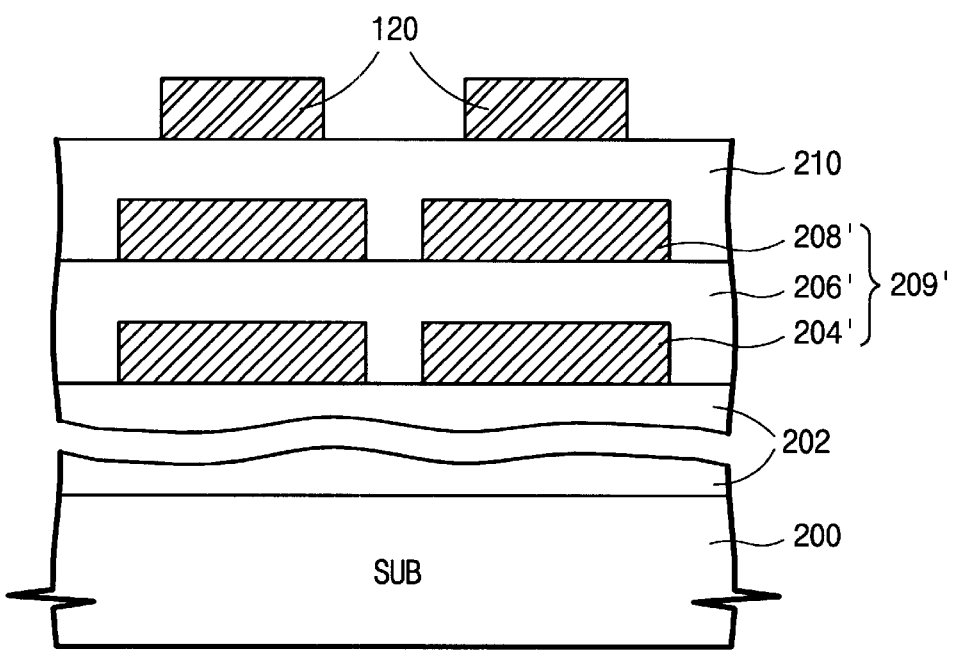
FIG. 4 is a cross-sectional view illustrating another lower structure of a bonding pad according to a second preferred embodiment of the present invention.

FIG. 4 is a cross-sectional view illustrating another lower structure of a bonding pad according to a second preferred embodiment of the present invention. As one of the foregoing methods for controlling the capacitance value, the conductive layers 204 and 208 of FIG. 3 are respectively divided into a plurality of conductive patterns 204' and 208' to the direction that the bonding pads 120 are arranged. The conductive patterns 204' and 208' and an insulating layer 206 compose a corresponding capacitor 209'. The distance D and the area A may be controlled such that the capacitors 209' have equal or different capacitance values with respect to each other.

A power stabilization circuit is conventionally integrated in a semiconductor integrated circuit device. The power stabilization circuit maintains an internal power supply voltage which is used as an operating voltage for the circuits integrated is in the core area 160 irrespective of power noise. The power stabilization circuit is formed to have considerably high capacitance by using a MOS capacitor or a conductive layer. With conductive material used in the core area 160 according to the preferred embodiment, a capacitor comprising the conductive layers 204 and 208 and the insulating layer 206 may be completed under the bonding pads 120, as the power stabilization circuit.

In a semiconductor integrated circuit device according to a second preferred embodiment of the present invention, a MOS capacitor is formed under the bonding pads 120. The MOS capacitor may be easily formed by using a conventional MOS transistor. That is, it is readily apparent to those skilled in the art that the source/drain electrodes of the MOS transistor may be electrically connected together and used as one electrode of a capacitor, and the gate electrode of the MOS capacitor may be used as another electrode, thereby easily forming the MOS capacitor.

Figure 5:
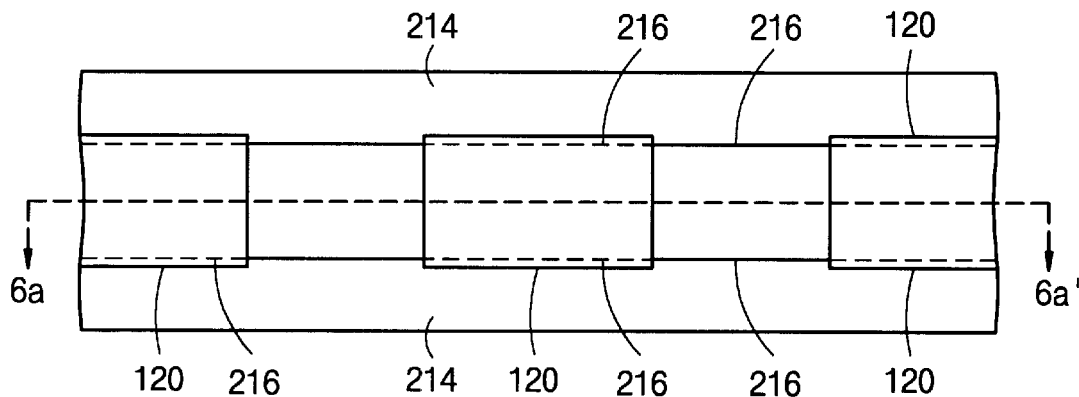
FIG. 5 is a cross-sectional view illustrating the structure of a MOS transistor according to a second preferred embodiment of the present invention.

FIG. 5 is a cross-sectional view illustrating the structure of a MOS transistor according to the second preferred embodiment of the present invention. An active region 214, a conductive layer 216, and the bonding pads 120 are shown in FIG. 5. Forming the source/drain regions of the MOS transistor integrated into the core area 160, ion is simultaneously implanted to form the active region 214. Forming a gate electrode of the MOS transistor, the conductive layer 216 is simultaneously formed. It is readily apparent to those skilled in the art that the width of the active region 214 may be made equal to or narrower than that of the bonding pads 120. However, in the second preferred embodiment the former is wider than the latter.

Figure 6:
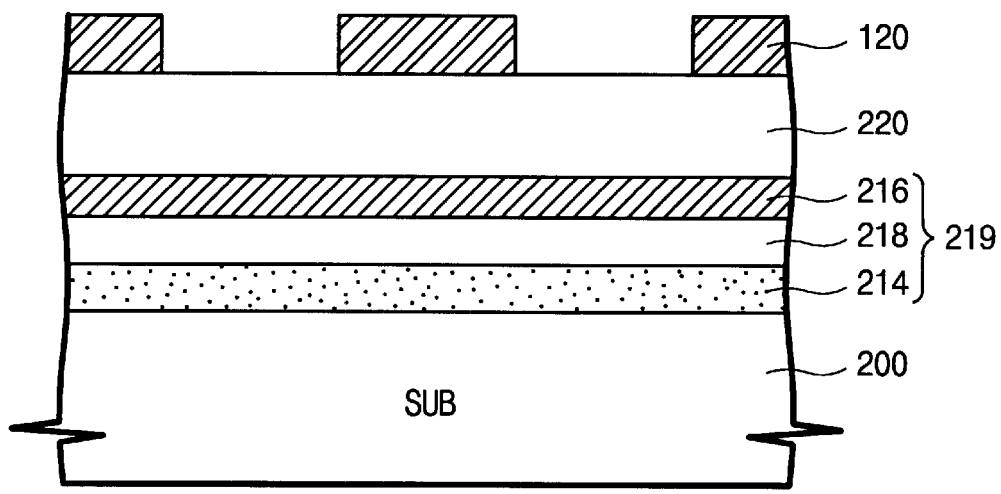
FIG. 6 is a cross-sectional view taken along a line 6a—6a of FIG. 5, illustrating a lower structure of a bonding pad.

FIG. 6 is a cross-sectional. view taken along a line 6a—6a of FIG. 5, illustrating a lower structure of a bonding pad. Accordingly, the same reference numerals in FIG. 5 and FIG. 6 denote the same components. As shown in FIG. 6, the active region 214 is formed on the semiconductor substrate 200. An insulating layer 218 is formed on the active region 214 (that is, a surface of the semiconductor substrate 200). The insulating layer 218 is made of gate oxide. In order to increase dielectric constant, the insulating layer 218 is made of insulating material having greater dielectric constant or the gate oxide layered on the insulating material. A conductive layer 216 is formed on the insulating layer 218. The conductive layer is made of conductive material (for example, polysilicon) used as a gate electrode. The bonding pads 120 are formed to be in contact with an insulating layer 220 formed on the conductive layer 216.

The conductive layer 216, the insulating layer 218, and the active region 214 may compose a capacitor 219. As shown in FIG. 2, the conductive layer 216 and the active region 214 are arranged to be grown to the direction that the bonding pads 120 are arranged, so that a high capacitance capacitor may be gained. Although not shown, a ground rail 208 and ground rails 204 may be arranged in the insulating layer 220 similar to the first preferred embodiment. Further, the active region 214 is grounded through a contact hole (not shown) and the conductive layer 216 is electrically connected to a power voltage through a contact hole (not shown). The capacitor may be also used as the power stabilization circuit.

Figure 7:
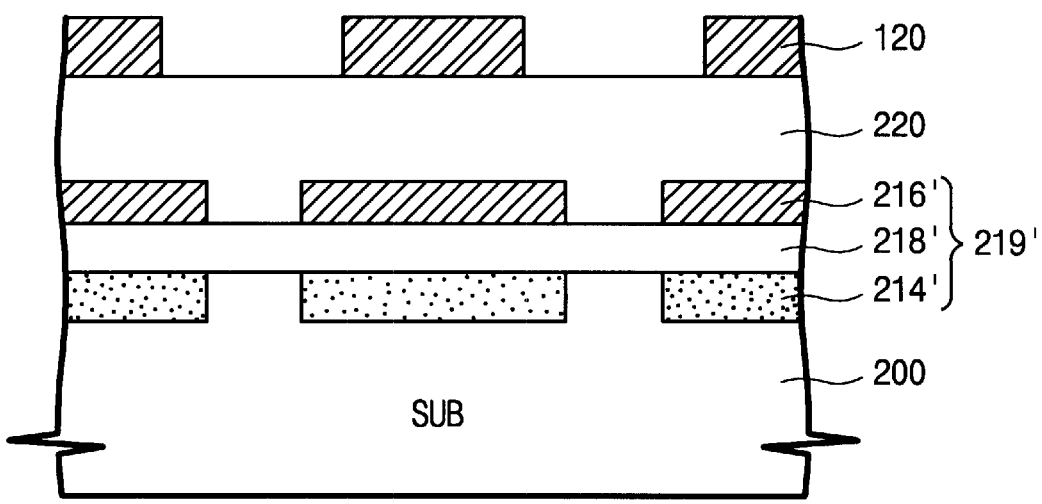
FIG. 7 is a cross-sectional view taken along a line 6a—6a of FIG. 5, illustrating another lower structure of a bonding pad.

FIG. 7 is a cross-sectional view taken along a line 6a—6a of FIG. 5, illustrating another lower structure of a bonding pad. A plurality of capacitors may be formed which are in contact with the core area and which have low capacitance. That is, active region 214 of FIG. 6 is divided into a plurality of active regions 214' and a conductive layer 216 is divided into a plurality of conductive patterns 216'. The corresponding active region 214', the corresponding conductive pattern 216', and an insulating layer 218' inserted therebetween compose capacitors 219', which may have different or equal capacitance values with respect to each other.

As mentioned above, conductive layers where an insulating layer is inserted are arranged to be grown under the bonding pads 120 and to the direction that the bonding pads 120 are arranged, so that a high capacitance capacitor is gained. Further, a power rail and a ground rail are arranged instead of the conductive layers. As a result, a high capacitance capacitor (or a plurality of low capacitance capacitors) is formed under the bonding pads and the power rail and the ground rail are arranged, thereby reducing a chip area.

Although the present invention has been described using such embodiments that two conductive layers exist between the bonding pad and the substrate, it is obvious to one skilled in the art that the present invention can be applied to such a structure that three or more conductive layers exist therebetween.

It is to be understood that although the present invention has been described with reference to a preferred embodiment, various modifications, known to those skilled in the art, may be made to the structure and process steps presented herein without departing from the invention as recited in the several claims appended hereto.

What is claimed is:

1. A semiconductor device, comprising:
   a semiconductor substrate having a main surface;
   a single insulating layer;
   a bonding pad formed on said main surfice; and
   a multi-layer wiring suture disposed between the main surfuce and the bonding pad, said multi-layer wiring structure comprising a first wiring layer, a second wiring layer, and an interlayer insulating fuin therbetween, wherein said first layer, said second layer, and said interlayer film form a capacitor disposed under said bonding pad, only the single insulating layer is disposed between the capacitor and the bonding pad, whre only the first layer of the multi-layers structure has a plurality of via holes under the bonding pad.

2. The semiconductor device of claim 1, wherein a width of said first wiring layer is substantially equal to a width of said bonding pad and a width of said second wiring layer is greater than the width of said bonding pad.

3. The semiconductor device of claim 1, wherein said capacitor is used to stabilize at least one of ground voltage noise and supply voltage noise.

4. The semiconductor device of claim 1, wherein the first layer and the second layer are respectively divided into a first plurality of conductive patterns and a second plurality of conductive patterns, and the first plurality of conductive patterns, the interlayer, and the second plurality of conductive patterns form a plurality of capacitors.

5. The semiconductor device of claim 4, wherein the plurality of capacitors are formed to have different capacitance values with respect to each other.

6. The semiconductor device of claim 1, wherein the first layer and the second layer are arranged in a same direction as the bonding pad.

7. A semiconductor device, comprising:
   a semiconductor subswtr having a main surface;
   a plurality of bonding pads formed on an area of said main surface;
   a first conductive layer having a plurality of first conductive patterns formed on said main surface and arranged along the area;
   a second conductive layer having a plurality of second conductive patterns formed between said main surface and said first conductive layer and arranged along said area to overlap with said first conductive patterns; and
   an insulating layer disposed between said first and said second conductive layers, wherein only the first conductive layer has a plurality of via holes under the plurality of bonding pads and said first conductive patterns, said second conductive patterns, and said insulating layer from a plurality of capacitors.

8. A seniconductor device, comprising:
   a semiconductor substrate having a main surface;
   a plurality of bonding pads formed on an area of said main surface;
   a first wiring layer arranged between said main surface and said pads and grown along said area;
   a second wiring layer arranged between said main surface and said first wiring layer and along said area; and
   an insulating layer arranged between and in contact with said wiring layers, wherein only the first wiring layer has a plurality of via holes under the bonding pads and said first wiring layer, said second wiring layer, and said insulating layer form a plurality of capacitors under the bonding pads.

9. The semiconductor device of claim 8, wherein said via holes of said first wiring layer reduce stress generated when said bonding pads are bonded to external package pins.

10. A semiconductor device having a plurality of bonding pads, coprising:
    a conductive semiconductor substrate having a main surface,
    an insulating layer formied on said main surface; and
    a MOS transistor having source/drain regions and a gate region, wherein
      the source/drain regions of the MOS transistor form a conductive active region in said seiconductor substrate;
      the gate region of the MOS transistor forms a conductive layer on said insulating layer,
      said conductive active region, said insulating layer, and said conductive layer are formed below the plurality of bonding pads, and only said conductive layer has a plurality of via holes under the bonding pads, and said active region, said insulating layer, and said conductive layer serve as a capacitor.

11. The semiconductor device of claim 10, wherein said active region is grounded, and said conductive layer is electrically coupled to a power voltage.

12. A semiconductor device having a plurality of bonding pads, compising:
- a conductive semiconductor substrate having a main surface;
- an insulating layer fored between said main surface and said conductive layer, only the conductive layer has a plurality of via holes under the bonding pads, and
- a MOS transistor having so drain regions and a gate region, wherein
  - the gate region of the MOS transistor forms a conductive layer having a plurality of conductive patterns on said main surface;
  - the source/drain regions of the MOS transistor form a plurality of conductive active regions in said semiconductor substrate; and
  - the plurality of conduictive patems, the insulating layer, and the plurality of conductive active regions serve as a plurality of capacitors.

13. The semiconductor device of claim 12, wherein said conductive patterns overlap corresponding said active regions.